United States Patent [19]

Tompsett et al.

[11] Patent Number: 5,324,965
[45] Date of Patent: Jun. 28, 1994

[54] LIGHT EMITTING DIODE WITH ELECTRO-CHEMICALLY ETCHED POROUS SILICON

[75] Inventors: Michael F. Tompsett, Summit, N.J.; Raphael Tsu, Charlotte, N.C.

[73] Assignee: The United States of America as represented by the Secretary of the Army, Washington, D.C.

[21] Appl. No.: 39,652

[22] Filed: Mar. 26, 1993

[51] Int. Cl.$^5$ .......................................... H01L 33/00
[52] U.S. Cl. ..................................... 257/103; 257/79; 257/14
[58] Field of Search .......................... 257/79, 103, 14; 313/498

[56] References Cited

U.S. PATENT DOCUMENTS 4,801,380 1/1989 Parker et al. ............... 210/500.21
5,206,523 4/1993 Goesele et al. ................. 257/21

OTHER PUBLICATIONS

Steiner et al., "Blue and Green Electroluminescence from a Porous Silicon Device," Electron Device Letters, vol. 14, No. 7, Jul. 1993.
Koshida, Nobuyoshi and Koyama, Hideki "Visible Electroluminescence From Porous Silicon", Appl. Phys. Lett. 60(3), Jan. 20, 1992.
Richter, A.; Lang, W.; Steiner, P.; Kozlowski, F.; and Sandmaier, H.; "Visible Electroluminescence of Porous Silicon Devices With a Solid State Contact", Mat. Res. Soc. Symp. Proc., vol. 256, 1992.
Bassous, E.; Freeman, M.; Halbout, J.-M.; Iyer, S. S.; Kesan V. P.; Munguia, P.; Pesarcik, S. F.; and Williams, B. L.; "Characterization Of Microporous Silicon Fabricated By Immersion Scanning", Mat. Res. Soc. Symp. Proc., vol. 256, 1992.
Namavar, Fereydoon; Maruska, H. Paul; and Kalkhoran, Nader M.; "Visible Electroluminescence From Porous Silicon np Heterojunction Diodes", Appl. Phys. Lett. 60 (20), May 18, 1992.
Canham, L. T., "Silicon Quantum Wire Array Fabrication By Electrochemical And Chemical Dissolution Of Wafers", Appl. Phys. Lett. 57 (10), Sep. 3, 1990.
Lehmann, V. and Gosele, U., "Porous Silicon Formation: A Quantum Wire Effect", Appl. Phys. Lett. 58 (8), Feb. 25, 1991.
Harvey et al., "Optical Studies of Electroluminescent Structures from Porous Silicon", Mat. Res. Soc. Symp. Proc., vol. 263, 1993.

Primary Examiner—Rolf Hille
Assistant Examiner—Minhloan Tran
Attorney, Agent, or Firm—Michael Zelenka; William H. Anderson

[57] ABSTRACT

A light emitting diode comprising microporous silicon of one conductivity type forming a PN junction with silicon of the opposite conductivity type and electrodes respectively connected to said regions, at least one of the electrodes being transparent.

11 Claims, 2 Drawing Sheets

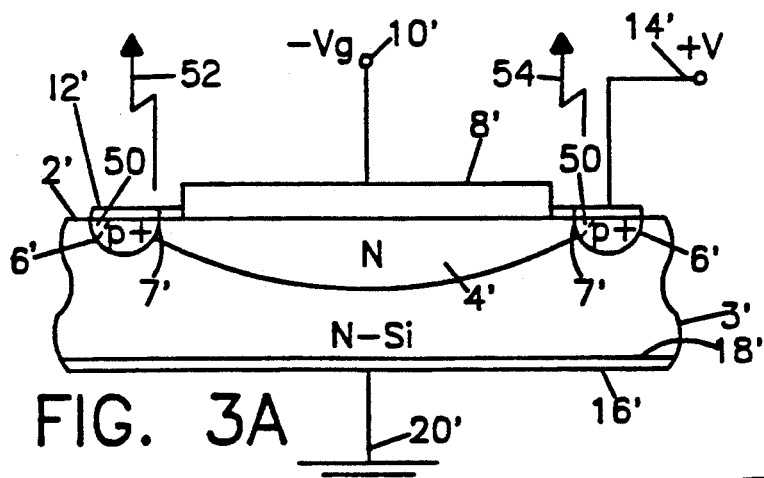
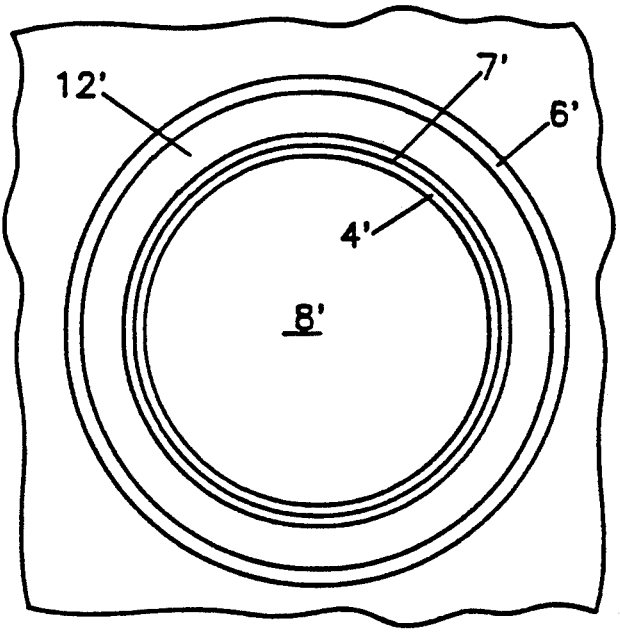
FIG. 3A  FIG. 3B
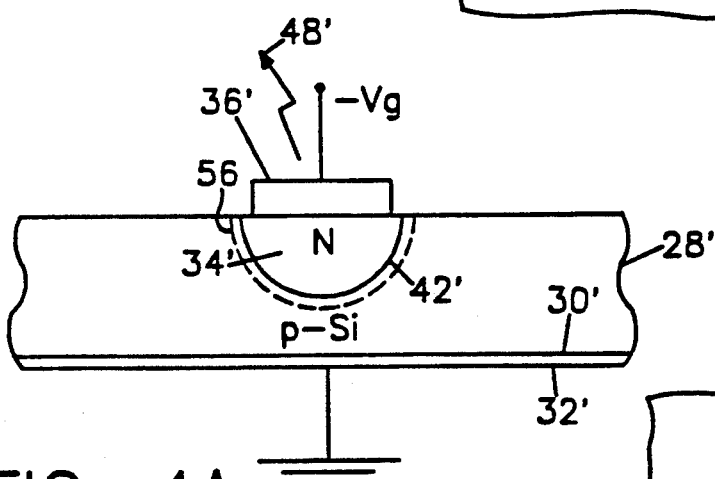
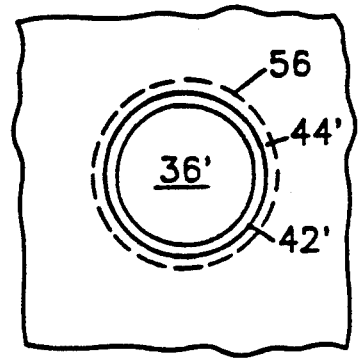
FIG. 4A  FIG. 4B

LIGHT EMITTING DIODE WITH ELECTRO-CHEMICALLY ETCHED POROUS SILICON

GOVERNMENT INTEREST

The invention described herein may be manufactured, used, and licensed by or for the Government of the United States of America without the payment to us of any royalty thereon.

FIELD OF THE INVENTION

This invention is related to the field of optoelectronics and more particularly to light emitting diodes.

BACKGROUND OF THE INVENTION

Electroluminescence in light emitting diodes, LED's, is useful in a number of applications including coupling between different chips of a circuit, driving an optical fiber communication system and driving a remote phased antenna array. Unfortunately, however, the LED's currently available are fabricated with GaAs so that they cannot, at the present time, be practicably integrated into circuits for the aforementioned applications and others that are generally formed in a silicon, Si, substrate.

The existence of photoluminescence in porous silicon has been reported in an article by L. T. Canham entitled "Silicon Quantum Wire Array Fabrication by Electrochemical and Chemical Dissolution of Wafers" that appeared at page 1046 of "Applied Physics Letters 57" of September 1990, and in an article by V. Lehmann and U. Gösele entitled "Porous Silicon Formation: A Quantum Wire Effect" that appeared at page 856 of "Applied Physics Letters 58" of February 1991, but no suggestion is made therein of a way of utilizing porous silicon for producing electroluminescence in an LED.

BRIEF SUMMARY OF THE INVENTION

In accordance with this invention, an LED is formed in a silicon substrate that is comprised of first and second regions, one of which is microporous, that are respectively doped so as to form a PN junction between them. In one embodiment of the invention, the first and second regions are laterally disposed along the surface of the substrate, and in another embodiment of the invention, the first and second regions are transversely disposed between one side of the substrate and the other.

BRIEF DESCRIPTION OF THE DRAWINGS

Various embodiments of the present invention are described below with reference to the drawings, in which like items are identified by the same reference designation, and in which:

FIG. 3A is a cross section of a silicon substrate having an LED incorporated therein that has laterally disposed regions forming a PN junction in which one of the regions has an N type microporous structure;

FIG. 3B is a top view of the type of LED illustrated in FIG. 3;

FIG. 4A is a cross section of a silicon substrate having a LED incorporated therein that has transversely disposed regions forming a PN junction in which one of the regions has an N type microporous structure; and FIG. 4B is a top view of the type of LED illustrated in FIG. 4A.

DETAILED DESCRIPTION OF THE DRAWINGS

Figure 1A:
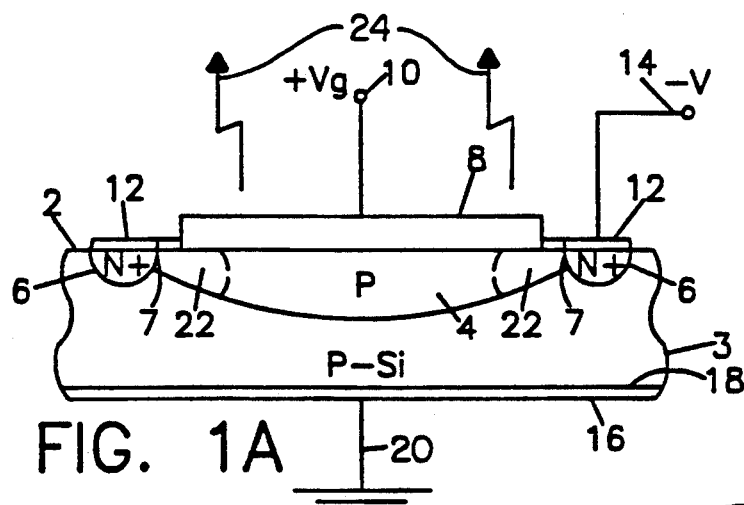
FIG. 1A is a cross section of a silicon substrate having an LED incorporated therein that has laterally disposed regions forming a PN junction, in which one of the regions has a P type microporous structure.
Figure 1B:
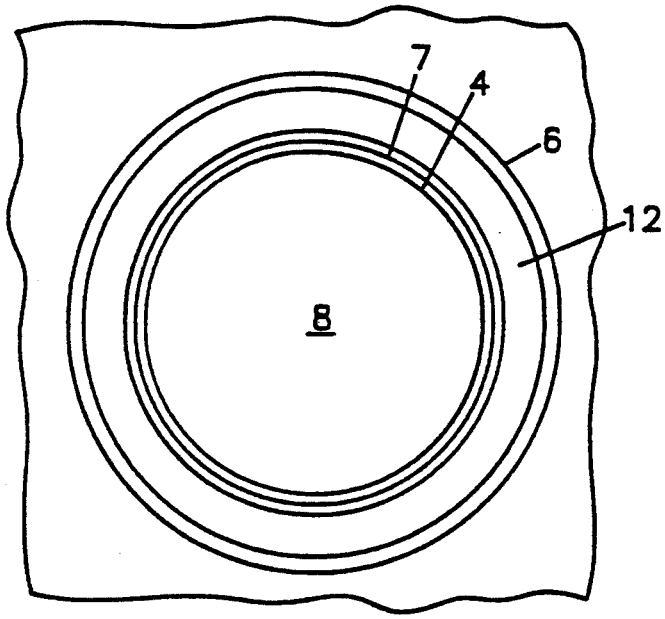
FIG. 1B is a top view of the type of LED illustrated in FIG. 1.

FIG. 1A is a cross section of an embodiment of the invention in which the regions forming the PN junction are laterally disposed along a first surface 2 of a silicon substrate 3 doped for P conductivity. A first region 4 of porous silicon is doped P-type, and a second region 6 of silicon, as can be seen in FIG. 1B to be preferably in the form of an annulus, is doped N-type. The porous silicon region 4 is formed by electrochemical etching. The first and second regions 4 and 6 thus form a circular PN junction 7 between them. A transparent electrode 8 that is in electrical contact with the porous region 4 but not in contact with the region 6 may be made of indium tin oxide, ITO. In use, the electrode 8 is connected to a point 10 which is at a $+V_g$ potential. An annular metal electrode 12 that is in ohmic electrical contact with the N-type region 6 is connected, in use, to a source 14 of $-V$ potential, and a metallic coating 16 on the surface 18 of the substrate 3 is connected to a source 20 of reference potential.

In operation, electrons from the second region 6 which is an N-type are incited across the junction 7 so as to recombine with holes in the first region 4, which is a P type, so as to emit light. The quantum confinement within the nanocrystallites of Si, within the porous silicon, causes the emitted light to be shifted in wavelength to the visible or near visible and enhances the emitted light intensity. Light thus produced passes through the transparent electrode 8 as indicated by arrows 24.

Figure 2A:
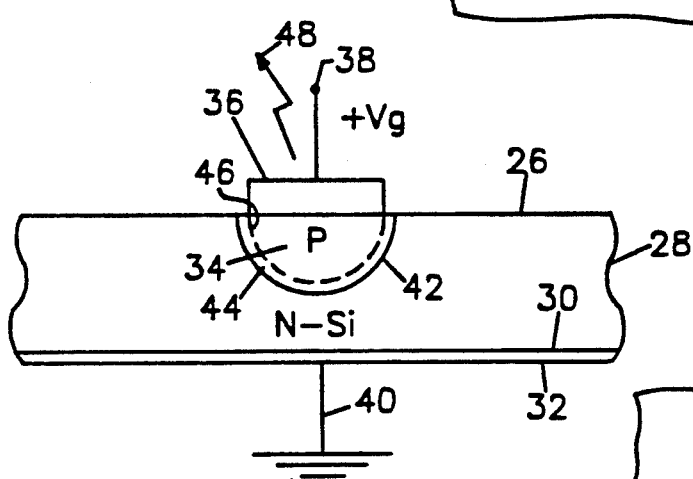
FIG. 2A is a cross section of a silicon substrate having an LED incorporated therein that has transversely disposed region forming a PN junction in which one of the regions has a P type microporous structure.

FIG. 2A is a cross section of an embodiment of the invention in which the regions forming the PN junction are transversely disposed between one surface 26 of a substrate 28 of N-type silicon and a surface 30 thereof that is covered with a metallic electrode 32. A first region 34 of P-type porous silicon material is formed by electrochemical etching of a portion of the region 34 is in electrical contact with a transparent electrode 36 of indium tin oxide. A second region is the silicon substrate 28 iteself, which has been previously doped P-type by ion implantation or diffusion process.

In operation, when a point 38 of $+V_g$ potential is connected to the electrode 36, and a point 40 of reference potential is connected to the electrode 32, a PN junction is formed along the line of demarcation 42 between the first region 34 and the material in the substrate 28 that forms the second region. Electrons from the substrate 28 recombine with holes in the region 34 so as to produce light, which passes through the transparent electrode 36 as indicated by an arrow 48.

FIG. 3A is a cross section of an embodiment of the invention that is like the embodiment of FIG. 1A in its general configuration but differs therefrom in that the type of materials used in corresponding regions are of the opposite conductivity type. FIG. 3B is a top view of an LED constructed as in FIG. 3A that corresponds to FIG. 1B. Regions and elements of FIGS. 3A and 3B that correspond to those of FIGS. 1A and 1B respectively, are designated by the same numerals primed.

The differences are that the substrate 3' is made of N type silicon rather than P type, the first region 4' is made of P-type porous silicon rather than N type, the annular second region 6' is made of P+ material rather than N+ material. The annular electrode 12' is made of transparent ITO. In addition, the point 10' is at $-V_g$ rather than $+V_g$ and the point 14' is at $+V$ rather than $-V$. Metal contact 8' is in ohmic contact with Region 4'.

In operation electrons from the N region 4' are injected into the annular P+ region 6' so as to produce light by recombination in the annular region 6'. Light thus produced passes through the transparent annular electrode 12' as indicated by arrow 52 and partly through the transparent electrode 8'.

FIG. 4A is an embodiment of the invention that is like the embodiment of FIG. 2A in its general configuration but differs therefrom in that the materials used in corresponding regions thereof are of the opposite conductivity type. FIG. 4B is a top view of an LED constructed as in FIG. 4A and corresponds to FIG. 2B. Regions and elements of FIGS. 4A and 4B that correspond to those of FIGS. 2A and 2B respectively are designated by the same numerals primed. The porous silicon region 34' is of the N type conductivity and the other region is the substrate 28' having P type conductivity.

As in FIG. 2A, a PN junction is formed between the N region 34' and the P region of the substrate 28'.

In operation, electrons from the N region 34' are injected into the P region 28' so as to produce light by recombination that passes through the transparent ITO electrode 36' as indicated by an arrow 48'.

Summarizing, it can be seen that an LED constructed in accordance with this invention would be comprised of adjacent regions of opposite conductivity types connected to respective electrodes wherein one of the regions is microporous silicon Si.

In FIGS. 1A and 1B, the P type porous silicon region 4 is laterally adjacent the N+ conductivity region 6, and in FIGS. 3A and 3B the N type conductivity region 4 is laterally adjacent the P type conductivity region 6'.

Figure 2B:
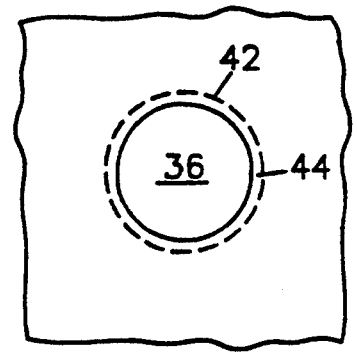
FIG. 2B is a top view of the type of LED illustrated in FIG. 2.

In FIGS. 2A and 2B, the porous silicon P type conductivity region 34 is transversely adjacent the N type conductivity region 28, and in FIGS. 4A and 4B the porous silicon N type conductivity region 34' is transversely adjacent the P type conductivity region 28'.

Although various embodiments of the invention are described herein for purposes of illustration, they are not meant to be limiting. Those of skill in the art may recognize modifications that can be made in the illustrated embodiments. Such modifications are meant to be covered by the spirit and scope of the appended claims.

What is claimed is:

1. A light emitting diode comprising:
    a first region of microporous silicon of one conductivity type;
    a second region of silicon of an opposite conductivity type, the second region being in electrical contact with said first region of microporous silicon;
    at least two electrodes electrically connected to said first and second regions; and
    a silicon substrate wherein said first and second regions are disposed within said silicon substrate.

2. A light emitting diode as set forth in claim 1 wherein said first and second regions are laterally disposed on a surface of the substrate.

3. A light emitting diode as set forth in claim 1 wherein said first and second regions are transversely disposed on a surface of said substrate.

4. A light emitting diode as set forth in claim 1 wherein said first region is of the P conductivity type and said second region is of the N conductivity type.

5. A light emitting diode as set forth in claim 1 wherein said first region is of the N conductivity type and said second region is of the P conductivity type.

6. A light emitting diode integrally incorporated in a silicon substrate of a first conductivity type comprising:
    a microporous region of the first conductivity type of the silicon substrate, the microporous region being formed by electrochemical etching and doping in a first surface of said substrate;
    a doped region of said silicon substrate being of a second conductivity type formed in contact with said microporous region, said doped region being formed by doping a first surface of said substrate;
    a first electrode conductively connected to said microporous region; and
    a second electrode conductively connected to said region of said second conductivity type.

7. A light emitting diode as set forth in claim 6 wherein said first electrode is transparent.

8. A light emitting diode as set forth in claim 6 wherein said first electrode is made of indium, tin oxide.

9. A light emitting diode as set forth in claim 6 wherein said region of the second conductivity type is annular.

10. A light emitting diode as set forth in claim 6 wherein:
    said first conductivity type is P and said second conductivity type is N+; and
    said first electrode is transparent.

11. A light emitting diode as set forth in claim 6 wherein said first conductivity type is N, said second conductivity type is P+ and said second electrode is transparent.

* * * * *